United States Patent
Kato (10) Patent No.: US 7,145,406 B2
(45) Date of Patent: Dec. 5, 2006

(54) PHASE ADJUSTING CIRCUIT AND OSCILLATOR INCLUDING THE SAME

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 45 days.

(21) Appl. No.: 11/016,987

(22) Filed: Dec. 20, 2004

(65) Prior Publication Data

US 2005/0212608 A1 Sep. 29, 2005

(30) Foreign Application Priority Data

Mar. 24, 2004 (JP) ............................. 2004-087188

(51) Int. Cl.
*H03B 5/12* (2006.01)
(52) U.S. Cl. ............................ 331/107 A; 331/107 SL; 331/107 DP; 331/96
(58) Field of Classification Search ............ 331/107 A, 331/107 SL, 107 DP, 96
See application file for complete search history.

(56) References Cited

FOREIGN PATENT DOCUMENTS

| JP | 01-251708 | 10/1989 |
|----|-----------|---------|
| JP | 02-306705 | 12/1990 |
| JP | 11-186691 | 7/1999 |
| JP | 2000-357921 | 12/2000 |
| JP | 2003-204220 | 7/2003 |

*Primary Examiner*—Arnold Kinkead
(74) *Attorney, Agent, or Firm*—Keating & Bennett, LLP (57) ABSTRACT

A phase adjusting circuit includes a meandering inductor provided on the surface of a base substrate, and a zero-ohm resistor mounted on two parallel line portions with one parallel line portion provided therebetween. The parallel line portions of the meandering inductor are configured such that their lengths in the vertical direction sequentially decrease. By changing a combination of parallel line portions on which the zero-ohm resistor is mounted, the substantial line length of the inductor is changed, such that the inductance changes. By changing the inductance of the inductor, the amount of phase adjustment in the phase adjusting circuit is changed.

11 Claims, 6 Drawing Sheets

PHASE ADJUSTING CIRCUIT AND OSCILLATOR INCLUDING THE SAME

BACKGROUND OF THE INVENTION

1. Field of the Invention

The present invention relates to a phase adjusting circuit for adjusting the phase of a signal to be transmitted, and an oscillator in which an oscillation loop circuit includes the phase adjusting circuit.

2. Description of the Related Art

A surface acoustic wave (SAW) oscillator using a SAW resonator as a resonant element ordinarily has a configuration in which a phase adjusting circuit including an inductor is connected in parallel to the SAW resonator in order to stabilize an oscillation frequency. A constant of this phase adjusting circuit is determined based on an oscillation frequency set beforehand when considering electrical characteristics of the SAW resonator.

All elements, such as SAW resonators, do not exhibit identical characteristics, but exhibit different characteristics in a set range of variations although the characteristics are substantially similar. Accordingly, when oscillators are constructed of the SAW resonators, a problem occurs in that each SAW resonator that is used changes the oscillation frequency of each oscillator.

Figure 6:
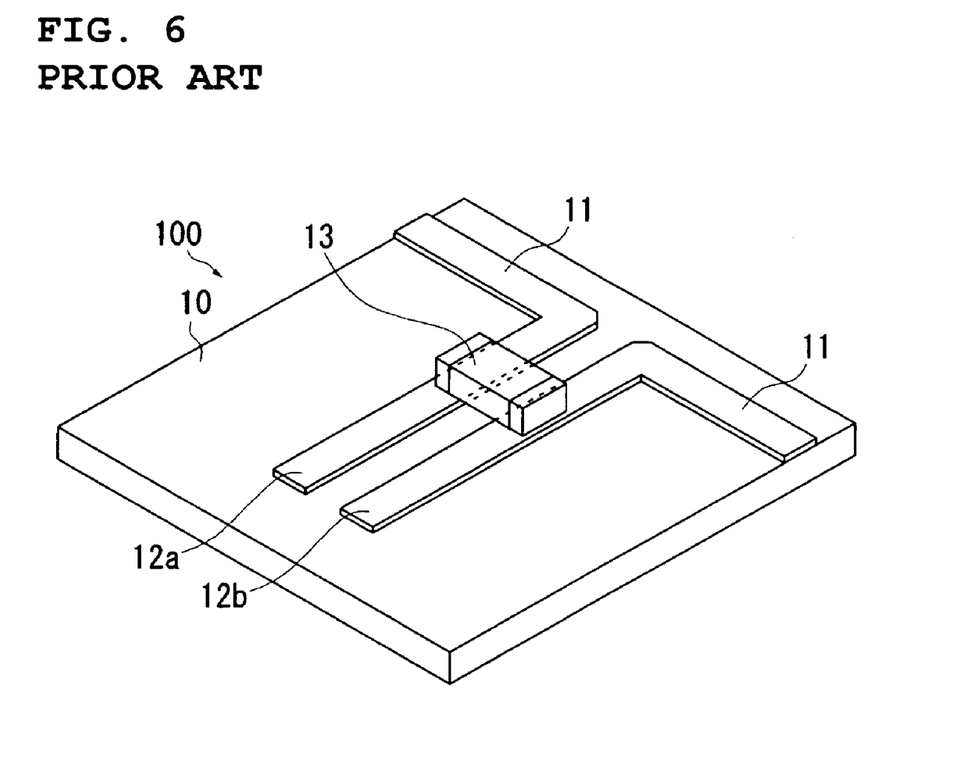
FIG. 6 is a perspective view showing a schematic configuration of a phase adjusting circuit of the related art.

Accordingly, as shown in FIG. 6, a SAW resonator for solving the above-described problem has been proposed. In the SAW resonator, the inductance of an inductor in a phase adjusting circuit connected in series to a resonant element can be changed (see, for example, Japanese Unexamined Patent Application Publication No. 2-306705).

FIG. 6 is a schematic perspective view of the configuration of the phase adjusting circuit of the related art (disclosed in Japanese Unexamined Patent Application Publication No. 2-306705).

As shown in FIG. 6, a phase adjusting circuit 100 has a shape defined by separating line electrodes 11 provided on one surface of a substrate at a predetermined point and bending the separated portions perpendicularly to the line electrodes 11 to form a pair of parallel end-open lines 12a and 12b. In the phase adjusting circuit 100, predetermined positions of the end-open lines 12a and 12b are set to be in conduction by a zero-ohm resistor 13. Accordingly, portions composed of the end-open line 12a, the zero-ohm resistor 13, and the end-open line 12b from the bending points of both lines define an inductor. By changing the mounting position of the zero-ohm resistor 13, the inductance is changed.

In the phase adjusting circuit 100 shown in FIG. 6, since intermediate points of the end-open lines 12a and 12b are set to be in conduction by the zero-ohm resistor 13, portions of the end-open lines 12a and 12b from the zero-ohm resistor 13 to their ends function as open stubs, thus causing an adverse effect on oscillation characteristics of the SAW oscillator. This makes it difficult to obtain a signal having an oscillation frequency having a value equal to that set beforehand. In addition, the distance between each point of connection to the zero-ohm resistor 13 and each end of the end-open lines 12a and 12b cannot be determined unless adjustment is performed after mounting the zero-ohm resistor 13. Thus, it is impossible to predict how the mounting position will cause an adverse effect on the circuit.

In addition, a variable range of the inductance is narrowed since the inductor is formed by only two parallel lines. Moreover, a large area is occupied by the inductor on the substrate which prevents a reduction in the size of the oscillator.

SUMMARY OF THE INVENTION

To overcome the problems described above, preferred embodiments of the present invention provide a phase adjusting circuit in which, even if the inductance of an inductor is changed, the change in inductance does not cause any adverse effects on an oscillation circuit, and which has a small size, and also provide an oscillator having an oscillation frequency stabilized by the phase adjusting circuit.

According to a preferred embodiment of the present invention, a phase adjusting circuit includes an inductor having an inductance that is used to adjust the phase of a signal, the inductor including at least three parallel line portions having different lengths such that the inductor has a meandering shape, and a plurality of connecting portions for sequentially connecting ends of the at least three parallel line portions, and a conduction element for establishing, in an arrangement direction in which the at least three parallel line portions are arranged, electrical conduction between two outermost parallel line portions among the at least three parallel line portions, with an odd number of parallel line portions provided between the two outermost parallel line portions.

In this configuration, in a portion set to be in conduction by the conduction element of the inductor, the signal is transmitted through the conduction element, such that the line length of the inductor is substantially shortened and the inductance is increased. In other words, the inductance differs between a case in which the conduction element is connected and a case in which the conduction element is not connected. In addition, since each parallel line portion has a different length, by changing the mounting location of the conduction element in the arrangement direction (substantially perpendicular to a longitudinal direction in which the parallel line portions extend) of the parallel line portions, the effective line length of the inductor is changed. Therefore, the inductance is changed in response to the mounting location of the conduction element, such that the amount of phase adjustment (delay in phase) changes.

Preferably, the lengths of the at least three parallel line portions in extending directions thereof sequentially decrease along the arrangement direction of the at least three parallel line portions.

In this configuration, the lengths of the parallel line portions of the inductor gradually increase or decrease along a predetermined direction (the arrangement direction of the parallel line portions). Thus, by changing the mounting position of the conduction element along the predetermined direction, the inductance is gradually decreased or increased.

According to another preferred embodiment of the present invention, an oscillator including the phase adjusting circuit and a resonant element is provided. The phase adjusting circuit is connected in series to the resonant element in an oscillation loop.

In this configuration, the inductance of the inductor in the phase adjusting circuit is adjusted in response to characteristics of the resonant element, whereby an inductance that is optimal for the oscillation frequency is set. Thus, the oscillation frequency of the oscillator including the resonant element and the phase adjusting circuit is stabilized.

Preferably, the resonant element is a SAW resonator.

In this configuration, the inductance of the inductor in the phase adjusting circuit is adjusted in response to characteristics of the SAW resonator, whereby an inductance that is optimal for the oscillation frequency is set. Thus, the oscillation frequency of the oscillator including the SAW resonator and the phase adjusting circuit is stabilized.

According to preferred embodiments of the present invention, by using a conduction element to establish conduction between parallel line portions defining a meandering inductor, the inductance of the inductor is changed. Thus, the amount of phase adjustment is easily changed. In addition, a portion of the inductor between the parallel line portions set to be in conduction by the conduction element does not function. Thus, an adverse effect on an oscillator in response to phase adjustment is prevented from occurring. This enables setting a desired amount of adjustment, such that a phase adjusting circuit is provided. In addition, by using this phase adjusting circuit, an oscillator that stably oscillates at a desired oscillation frequency is obtained.

By mounting a conduction element on parallel line portions, the sizes of a phase adjusting circuit and an oscillator including the same are reduced without increasing an area occupied by the conduction element with respect to a mounting substrate since the conduction element is provided within a region in which a meandering inductor is disposed.

According to preferred embodiments of the present invention, parallel line portions of a meandering inductor gradually change along a predetermined direction, whereby an inductance, that is, the amount of phase adjustment, can be gradually changed by changing the mounting location of a conduction element along the predetermined direction. Therefore, a phase adjusting circuit in which a desired amount of phase adjustment is easily set is provided. Moreover, an oscillator that stably oscillates at a desired oscillation frequency is easily obtained.

Other features, elements, steps, characteristics and advantages of the present invention will become more apparent from the following detailed description of preferred embodiments with reference to the attached drawings.

DETAILED DESCRIPTION OF PREFERRED EMBODIMENTS

A phase adjusting circuit according to preferred embodiments of the present invention and an oscillator including the phase adjusting circuit are described with reference to the accompanying drawings. In the present preferred embodiment, a variable frequency SAW oscillator is used as an example of the oscillator but the present invention is not limited thereto.

Figure 1:
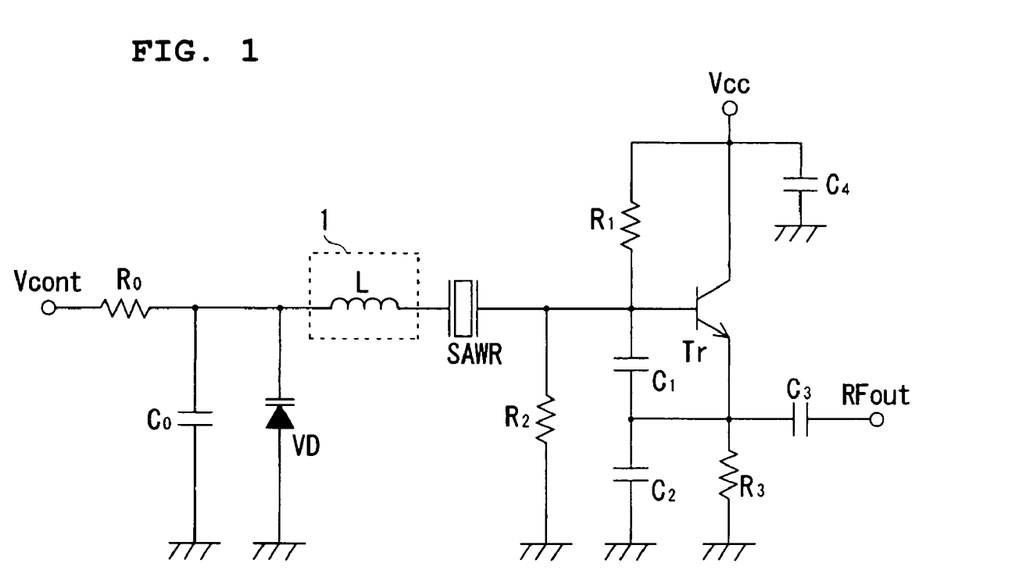
FIG. 1 is an equivalent circuit diagram of a SAW oscillator according to a preferred embodiment of the present invention.

FIG. 1 is an equivalent circuit diagram of a variable frequency SAW oscillator according to the present preferred embodiment. As shown in FIG. 1, one end of a SAW oscillator SAWR is connected to the base of an NPN transistor (hereinafter simply referred to as a "transistor") Tr that exhibits negative resistance in a frequency around an oscillation frequency, and the emitter of the transistor Tr is connected to an output terminal RFout through a capacitor $C_3$. The emitter of the transistor Tr is grounded through a resistor $R_3$ and a capacitor $C_2$. A capacitor $C_1$ is connected between the emitter and base of the transistor Tr. The base of the transistor Tr is connected to a driving voltage signal input terminal Vcc through a resistor $R_1$ and is grounded through a resistor $R_2$. The collector of the transistor Tr is connected to the driving voltage signal input terminal Vcc. The driving voltage signal input terminal Vcc is grounded for high frequency by a capacitor $C_4$.

The other terminal of the SAW resonator SAWR is connected to the anode of a varactor diode VD. The anode of the varactor diode VD is grounded. A junction of an inductor L and the varactor diode VD is grounded through a capacitor $C_0$, and is connected to a control voltage signal input terminal Vcont through a resistor $R_0$.

This configuration defines a variable frequency Colpitts oscillator which uses the negative resistance transistor Tr and in which an oscillation frequency is changed in accordance with a control voltage signal. The above-described component elements and terminals are mounted on a base substrate or are provided as electrodes.

In this Colpitts oscillator, the oscillation frequency is set based on a constant of an element connected to an oscillation loop including the negative resistance transistor. In the SAW oscillator shown in this preferred embodiment, in a series circuit of the varactor diode V, the inductor L of the phase adjusting circuit 1, and the SAW resonator SAWR, by changing a voltage applied to the varactor diode VD, that is, the control voltage signal, the capacitance of the varactor diode VD is adjusted to set the oscillation frequency. At this time, by connecting the inductor L of the phase adjusting circuit 1 to the SAW resonator SAWR in series, the oscillation frequency is adjusted and its variable range is adjusted. In addition, by using the inductor L, the phase is adjusted, such that variations in the oscillation frequency are minimized.

Next, the structure of the phase adjusting circuit 1 is described with reference to FIGS. 2, and 3A to 3D.

Figure 2:
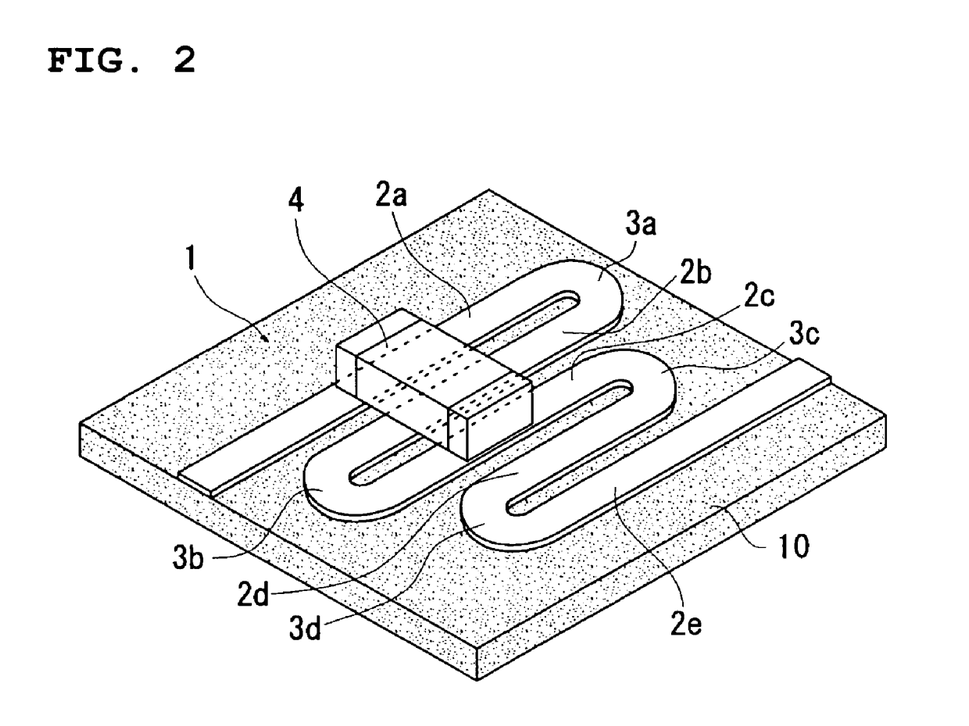
FIG. 2 is a perspective view showing a schematic configuration of a phase adjusting circuit for use in the SAW oscillator shown in FIG. 1.
Figure 3A:
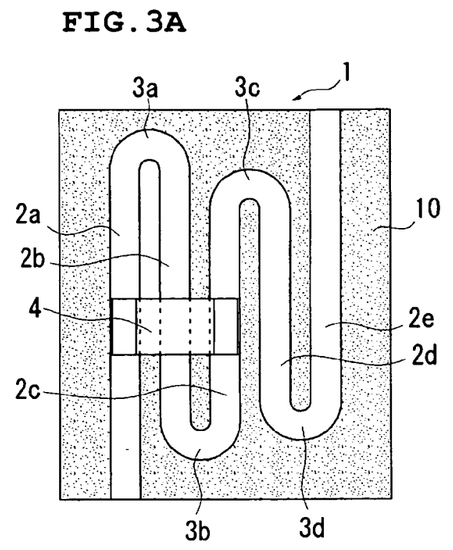
FIGS. 3A to 3D are plan views showing a phase adjusting circuit of preferred embodiments of the present invention.
Figure 3B:
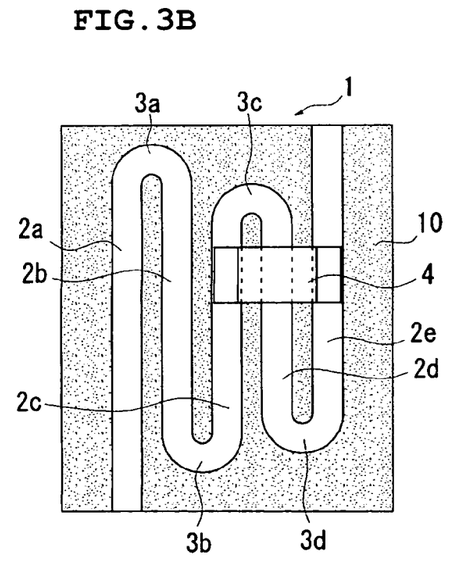
Figure 3C:
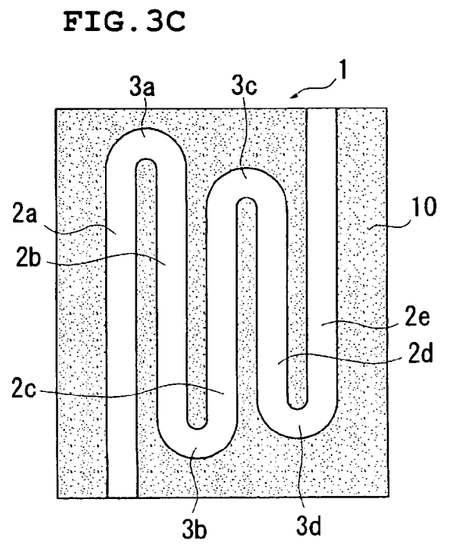
Figure 3D:
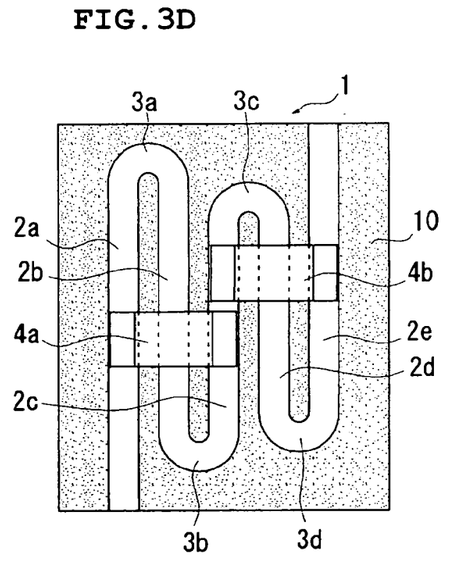

FIG. 2 is a perspective schematic view showing the configuration of the phase adjusting circuit 1 (in this preferred embodiment) for use in the SAW oscillator shown in FIG. 1. FIG. 3A is a plan view of the phase adjusting circuit 1 shown in FIG. 2. FIGS. 3B to 3D are plan views showing other configurations of the phase adjusting circuit 1.

As shown in FIGS. 2 and 3A, the phase adjusting circuit 1 is defined by an inductor including a meandering circuit electrode disposed on the surface of a base substrate 10, and a zero-ohm resistor 4 mounted on the circuit electrode of the inductor. Electrodes at two ends of the phase adjusting circuit 1 are connected to a SAW resonator (not shown) and the varactor diode VD, respectively. The zero-ohm resistor 4 corresponds to a "conduction element" in the description of preferred embodiments of the present invention.

The meandering inductor includes five parallel line portions 2a to 2e arranged at substantially regular intervals, a connecting portion 3a connecting the parallel line portions 2a and 2b, a connecting portion 3b connecting the parallel line portions 2b and 2c, a connecting portion 3c connecting the parallel line portions 2c and 2d, and a connecting portion 3d connecting the parallel line portions 2d and 2e. In the meandering inductor, the parallel line portion 2a, the connecting portion 3a, the parallel line portion 2b, the connecting portion 3b, the parallel line portion 2c, the connecting portion 3c, the parallel line portion 2d, the connecting portion 3d, and the parallel line portion 2e are sequentially connected from the end on the side of the varactor diode VD to the end on the side of the SAW resonator SAWR. The parallel line portions 2a to 2e are arranged so that their lengths in their extending directions (perpendicularly to the direction of arrangement) sequentially decrease along the direction of arrangement. The parallel line portion 2e looks longer than the parallel line portion 2d. This is because a lead line is provided so as to be continuous with the parallel line portion 2e. Accordingly, this does not contradict the phrase "sequentially decrease".

The zero-ohm resistor 4 is disposed such that its inter-terminal direction (longitudinal direction) is substantially parallel to a direction in which the parallel line portions 2a to 2e of the inductor are arranged. Two terminals of the zero-ohm resistor 4 are connected to the parallel line portions 2a and 2c, respectively, with the parallel line portion 2b provided therebetween. In this arrangement, in the inductor, portions of the parallel line portions 2a and 2e, the parallel line portion 2b, and all the connecting portions 3a and 3b do not function, such that the overall line length is less as compared to a state (the state shown in FIG. 3C) in which the zero-ohm resistor 4 is not mounted, and the inductance decreases. In this case, lines in a portion short-circuited by the zero-ohm resistor 4, that is, portions of the parallel line portions 2a and 2c, the parallel line portion 2b, and all the connecting portions 3a and 3b, do not function as an open stub. Thus, these do not substantially affect the transmission signal, and have no adverse effect on the SAW resonator.

Next, the state shown in FIG. 3B is described below.

In the state shown in FIG. 3B, the zero-ohm resistor 4 is connected to the parallel line portions 2c and 2e, with the parallel line portion 2d provided therebetween. In this state, in the inductor, portions of the parallel line portions 2c and 2e, the parallel line portion 2d, and all the connecting portions 3c and 3d do not function, such that the line length is less than that in the state (the state shown in FIG. 3C) in which the zero-ohm resistor 4 is not mounted, and the inductance decreases. In addition, the parallel line portion 2d is shorter than the parallel line portion 2b and the parallel line portions 2c and 2e are shorter than the parallel line portions 2a and 2c, respectively. Accordingly, a line length that is short-circuited by the zero-ohm resistor 4 is smaller in the state shown in FIG. 3B than in the state shown in FIG. 3A. In other words, the state shown in FIG. 3B has a line length greater than that in the state shown in FIG. 3A. Therefore, the inductance in the state shown in FIG. 3B is greater than that in the state shown in FIG. 3A although the zero-ohm resistor 4 is similarly mounted with one parallel line portion provided between its terminals.

Next, the state shown in FIG. 3D is described below.

In the state shown in FIG. 3D, a zero-ohm resistor 4a is mounted on the parallel line portions 2a and 2c with the parallel line portion 2b provided therebetween, and a zero-ohm resistor 4b is mounted on the parallel line portions 2c and 2e with the parallel line portion 2d provided therebetween. In this state, in the inductor, portions of the parallel line portions 2a, 2c, and 2e, the parallel line portions 2b and 2d, and all the connecting portions 3a to 3d do not function, such that the line length is shorter than that in a state (the state shown in FIG. 3C) in which the zero-ohm resistors 4a and 4b are not mounted, and the inductance decreases. In this state, the inductor in the phase adjusting circuit 1 is defined only by the portions of the parallel line portions 2a and 2e and a portion of the parallel line portion 2c between the zero-ohm resistors 4a and 4b. Thus, the inductance in the state shown in FIG. 3D is much smaller than that in each of the state shown in FIGS. 3A and 3B.

Next, simulated inductances between a state in which a zero-ohm resistor is mounted and a state in which the zero-ohm resistor is not mounted are described below.

Figure 4A:
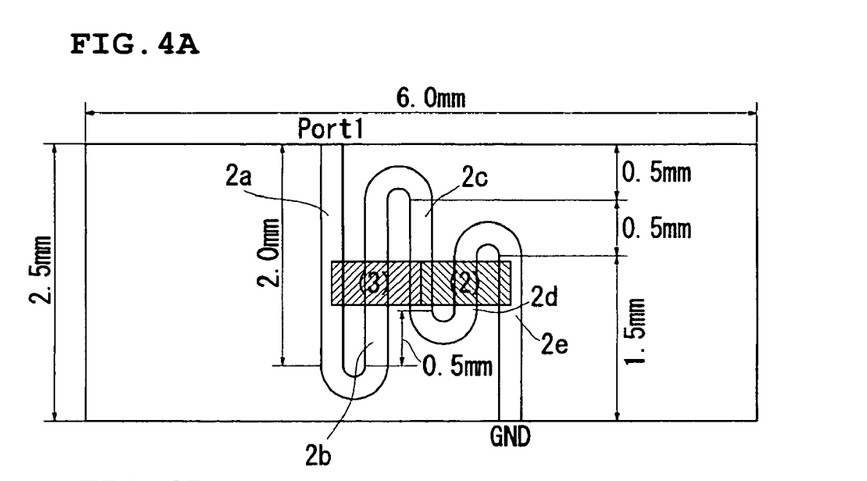
FIG. 4A is a dimensional illustration showing simulation conditions.
Figure 4B:
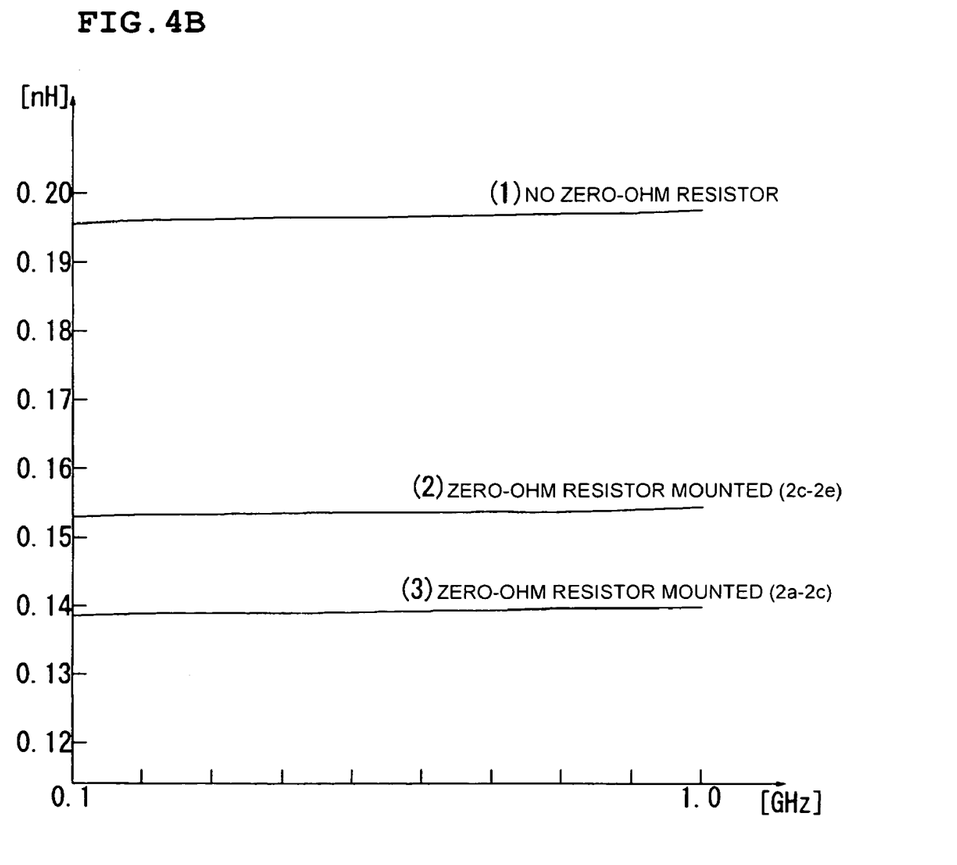
FIG. 4B is a graph showing frequency characteristics of inductances obtained by simulation.

FIG. 4A is a dimensional illustration showing simulation conditions, and FIG. 4B is a graph showing frequency characteristics of inductances obtained by the simulation.

The simulations were performed by using a base substrate as shown in the plan view in FIG. 4A for a state with a zero-ohm resistor mounted and a state with no zero-ohm resistor mounted. Specifically, the material for the base substrate used in the simulations was FR4. The base substrate had an external size of about 6.0 mm by about 2.5 mm, and a thickness of about 1.0 mm, for example. An electrode pattern defining the inductor had a width of about 0.2 mm and a thickness of about 0.05 mm, for example. A parallel line portion 2a connecting to Port1 had a length of about 2.0 mm, for example. A parallel line portion 2e connecting to the ground potential GND had a length of about 1.5 mm, for example. Parallel line portions 2b, 2c, and 2d had thicknesses of about 1.5 mm, about 1.0 mm, and about 0.5 mm in the order viewed from Port1, for example. Each interval among the parallel line portions 2a to 2e was about 0.2 mm, for example. Under these conditions, simulations were performed in states (1) in which a zero-ohm resistor was not used, (2) in which the zero-ohm resistor was connected to the parallel line portions 2c and 2e, and (3) in which the zero-ohm resistor was connected to the parallel line portions 2a and 2c.

In addition, in the simulations, under the above conditions, by using a three-dimensional electromagnetic simulator, S parameters (reflection coefficients) of patterns from 100 MHz to 1 GHz by 100 MHz were calculated and converted into impedances (Z parameters). Based thereon, inductances were calculated. The simulated values are shown in the following Tables 1 to 3. Table 1 shows the state (1), Table 2 shows the state (2), and Table 3 shows the state (3). Frequency characteristics of inductances obtained from the tables are shown in FIG. 4B.

TABLE 1

| REAL PART OF S11 | IMAGINARY PART OF S11 | FREQUENCY [GHz] | EQUIVALENT INDUCTANCE [nH] |
|---|---|---|---|
| $-9.99994 \times 10^{-1}$ | $3.48381 \times 10^{-3}$ | 0.10 | 0.13862 |
| $-9.99976 \times 10^{-1}$ | $6.96929 \times 10^{-3}$ | 0.20 | 0.13865 |
| $-9.99945 \times 10^{-1}$ | $1.04581 \times 10^{-2}$ | 0.30 | 0.13871 |
| $-9.99903 \times 10^{-1}$ | $1.39520 \times 10^{-2}$ | 0.40 | 0.13879 |
| $-9.99848 \times 10^{-1}$ | $1.74527 \times 10^{-2}$ | 0.50 | 0.13889 |
| $-9.99780 \times 10^{-1}$ | $2.09619 \times 10^{-2}$ | 0.60 | 0.13902 |
| $-9.99700 \times 10^{-1}$ | $2.44812 \times 10^{-2}$ | 0.70 | 0.13917 |
| $-9.99608 \times 10^{-1}$ | $2.80126 \times 10^{-2}$ | 0.80 | 0.13935 |
| $-9.99502 \times 10^{-1}$ | $3.15578 \times 10^{-2}$ | 0.90 | 0.13955 |
| $-9.99383 \times 10^{-1}$ | $3.51187 \times 10^{-2}$ | 1.00 | 0.13978 |

TABLE 2

| REAL PART OF S11 | IMAGINARY PART OF S11 | FREQUENCY [GHz] | EQUIVALENT INDUCTANCE [nH] |
|---|---|---|---|
| $-9.99993 \times 10^{-1}$ | $3.84307 \times 10^{-3}$ | 0.10 | 0.15291 |
| $-9.99970 \times 10^{-1}$ | $7.68818 \times 10^{-3}$ | 0.20 | 0.15295 |
| $-9.99933 \times 10^{-1}$ | $1.15374 \times 10^{-2}$ | 0.30 | 0.15302 |
| $-9.99882 \times 10^{-1}$ | $1.53927 \times 10^{-2}$ | 0.40 | 0.15312 |
| $-9.99815 \times 10^{-1}$ | $1.92563 \times 10^{-2}$ | 0.50 | 0.15325 |
| $-9.99733 \times 10^{-1}$ | $2.31302 \times 10^{-2}$ | 0.60 | 0.15341 |
| $-9.99635 \times 10^{-1}$ | $2.70165 \times 10^{-2}$ | 0.70 | 0.15359 |
| $-9.99522 \times 10^{-1}$ | $3.09174 \times 10^{-2}$ | 0.80 | 0.15381 |
| $-9.99393 \times 10^{-1}$ | $3.48351 \times 10^{-2}$ | 0.90 | 0.15405 |
| $-9.99248 \times 10^{-1}$ | $3.87720 \times 10^{-2}$ | 1.00 | 0.15433 |

TABLE 3

| REAL PART OF S11 | IMAGINARY PART OF S11 | FREQUENCY [GHz] | EQUIVALENT INDUCTANCE [nH] |
|---|---|---|---|
| $-9.99988 \times 10^{-1}$ | $4.91384 \times 10^{-3}$ | 0.10 | 0.19552 |
| $-9.99952 \times 10^{-1}$ | $9.83051 \times 10^{-3}$ | 0.20 | 0.19558 |
| $-9.99891 \times 10^{-1}$ | $1.47529 \times 10^{-2}$ | 0.30 | 0.19568 |
| $-9.99806 \times 10^{-1}$ | $1.96838 \times 10^{-2}$ | 0.40 | 0.19582 |
| $-9.99697 \times 10^{-1}$ | $2.46261 \times 10^{-2}$ | 0.50 | 0.19600 |
| $-9.99562 \times 10^{-1}$ | $2.95827 \times 10^{-2}$ | 0.60 | 0.19622 |
| $-9.99403 \times 10^{-1}$ | $3.45567 \times 10^{-2}$ | 0.70 | 0.19648 |
| $-9.99218 \times 10^{-1}$ | $3.95510 \times 10^{-2}$ | 0.80 | 0.19679 |
| $-9.99006 \times 10^{-1}$ | $4.45687 \times 10^{-2}$ | 0.90 | 0.19714 |
| $-9.98769 \times 10^{-1}$ | $4.96130 \times 10^{-2}$ | 1.00 | 0.19753 |

As shown in Tables 1 to 3 and FIG. 4B, by mounting the zero-ohm resistor, the inductance of the inductor in the phase adjusting circuit changes. Specifically, the state (1) has an inductance of approximately 0.196 nH, the state (2) has an inductance of approximately 0.152 nH, and the state (3) has an inductance of approximately 0.139 nH. In other words, the inductance can be changed by approximately 10% to approximately 20%.

As described above, by mounting the zero-ohm resistor, or changing parallel line portions on which the zero-ohm resistor is to be mounted, the inductance of the inductor (the inductor L in FIG. 1) in the phase adjusting circuit 1 can be changed. For example, in the case of the states in FIGS. 3A to 3D, the inductance decreases in the order of the states shown in FIGS. 3C, 3B, 3A, and 3D. This changes the inductance of the phase adjusting circuit 1, such that a delay in phase is adjusted. In other words, by adjusting the delay in phase in response to electrical characteristics of the SAW resonator SAWR, the SAW resonator SAWR can be oscillated.

The zero-ohm resistor may be mounted so as to have an inductance calculated beforehand for the inductor provided on the base substrate 10 in accordance with characteristics of the SAW resonator SAWR. The zero-ohm resistor may be mounted while observing the oscillation frequency and variable frequency range of the oscillator. This enables a SAW oscillator having desired oscillation characteristics (an oscillation frequency, a variable frequency range, etc.) to be easily adjusted.

The zero-ohm resistor may be mounted at any location in a direction in which each parallel line portion extends if the zero-ohm resistor is mounted on the same parallel line portions. This is because, by mounting the zero-ohm resistor across one parallel line portion such that the line length is short-circuited, the line length short-circuited does not substantially change regardless of the mounting position of the zero-ohm resistor. Accordingly, the mounting location of the zero-ohm resistor is not strictly limited, such that the zero-ohm resistor can be easily mounted. This adjusts the inductance of the inductor in the phase adjusting circuit. Moreover, the oscillation characteristics of the SAW oscillator can be easily adjusted.

In addition, by mounting the zero-ohm resistor on a meandering inductor, an area occupied by the phase adjusting circuit is not increased. This enables the size of the phase adjusting circuit and SAW oscillator to be decreased.

In the description above, the line length of the inductor in the phase adjusting circuit is changed by mounting the zero-ohm resistor. However, a component (element) having a small impedance for a signal, such as a chip inductor having a small inductance or a chip capacitor having a large capacitance, may be used.

In the description above, an inductor having five parallel line portions is preferably used as an example. The inductor may include at least three parallel line portions. However, for example, the inductor shown in each of FIGS. 5A to 5C may include four parallel line portions. The above-described configuration can be applied to any inductor as long as it includes at least three parallel line portions.

Figure 5A:
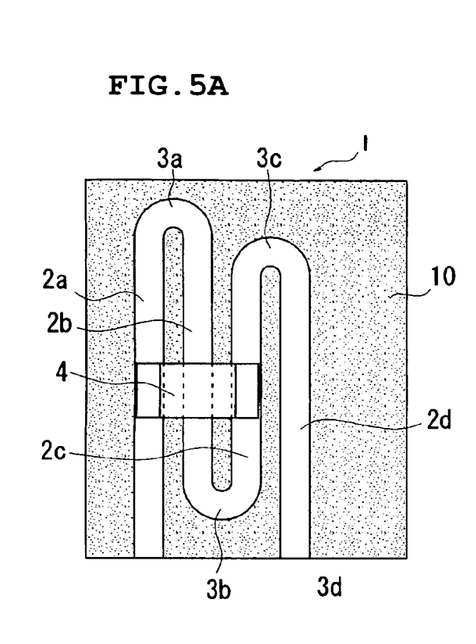
FIGS. 5A to 5C are plan views each showing a phase adjusting circuit in which parallel lines have four inductors.
Figure 5B:
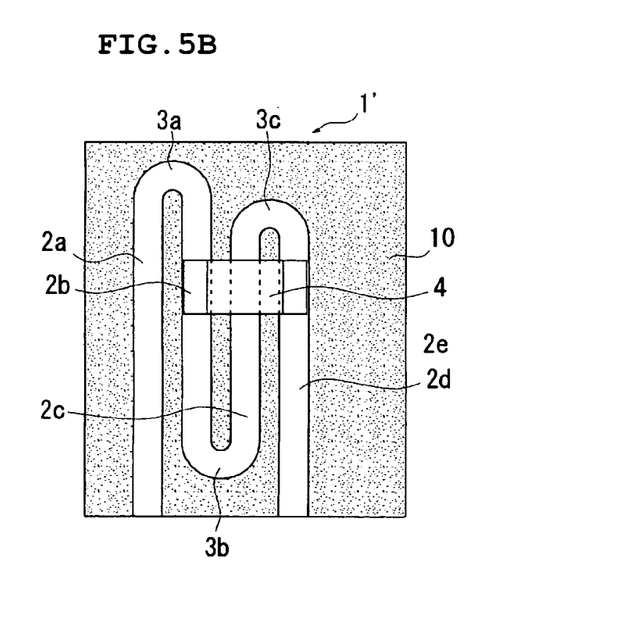
Figure 5C:
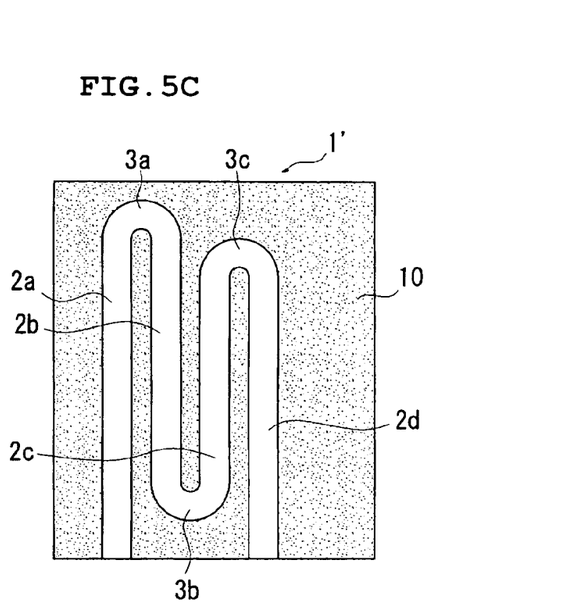

FIGS. 5A to 5C are plan views showing a phase adjusting circuit 1' in which parallel line portions have four inductors. FIG. 5A shows a state in which a zero-ohm resistor 4 is mounted on parallel line portions 2a and 2c. FIG. 5B shows a state in which the zero-ohm resistor 4 is mounted on parallel line portions 2b and 2d. FIG. 5C shows a state in which no zero-ohm resistor is mounted. In this case, the line length of the inductor shortens in the order of FIGS. 5C, 5B, and 5A.

The above-described preferred embodiments preferably have a configuration in which a zero-ohm resistor is arranged across a parallel line portion. However, the number of parallel line portions across which the zero-ohm resistor is mounted is not limited to one. The use of an odd number of parallel line portions can provide operations and advantages in the case having one parallel line portion.

In the above description, the lengths of parallel line portions decrease from the varactor diode VD to the SAW resonator SAWR. However, the lengths of parallel line portions may be increased from the side of the varactor diode VD to the side of the SAW resonator SAWR.

In the above description, a one-port-input SAW resonator has been described. However, the configuration of the above-described phase adjusting circuit can also be applied to a SAW oscillator having a two-port-input SAW resonator, and advantages similar to those described above are obtained.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A phase adjusting circuit comprising:
  an inductor having an inductance that is used to adjust the phase of a signal, said inductor comprising:
    at least three parallel line portions having different lengths such that said inductor has a meandering shape; and a plurality of connecting portions for sequentially connecting ends of said at least three parallel line portions; and a conduction element for establishing, in an arrangement direction in which said at least three parallel line portions are arranged, electrical conduction between two parallel line portions among said at least three parallel line portions, with an odd number of parallel line portions disposed between the two parallel line portions, such that the conduction element is disposed above and selectively connected to an upper surface of each of the two parallel line portion, and extends across and above an upper surface of each of the odd number of parallel line portions.

2. The phase adjusting circuit according to claim 1, wherein the lengths of said at least three parallel line portions in an extending direction thereof sequentially decrease along the arrangement direction of said at least three parallel line portions.

3. The phase adjusting circuit according to claim 1, wherein the conduction element is a zero-ohm resistor.

4. The phase adjusting circuit according to claim 1, further comprising a base substrate, wherein the at least three parallel line portions and the plurality of connecting portions of the inductor are disposed on said base substrate.

5. The phase adjusting circuit according to claim 1, wherein the at least three parallel line portions include five parallel line portions.

6. The phase adjusting circuit according to claim 1, wherein the at least three parallel line portions include four parallel line portions.

7. The phase adjusting circuit according to claim 4, wherein the base substrate has an external size of about 6.0 mm by about 2.5 mm and a thickness of about 1.0 mm.

8. The phase adjusting circuit according to claim 1, wherein the at least three parallel line portions have a width of about 0.2 mm and a thickness of about 0.05 mm.

9. The phase adjusting circuit according to claim 1, wherein each interval between the at least three parallel line portions is about 0.2 mm.

10. An oscillator comprising:

the phase adjusting circuit according to claim 1; and a resonant element; wherein the phase adjusting circuit is connected in series to said resonant element in an oscillation loop.

11. The oscillator according to claim 10, wherein said resonant element is a surface acoustic wave resonator.

* * * * *